United States Patent [19]
Zennamo, Jr. et al.

[11] Patent Number: 5,148,133
[45] Date of Patent: Sep. 15, 1992

[54] QUALITY FACTOR IMPROVEMENT FOR FILTER APPLICATIONS

[75] Inventors: Joseph A. Zennamo, Jr., Skaneateles; Gary J. Clark, Constantia, both of N.Y.

[73] Assignee: Eagle Comtronics, Inc., Clay, N.Y.

[21] Appl. No.: 707,070

[22] Filed: May 29, 1991

[51] Int. Cl.$^5$ .............................. H03H 7/00
[52] U.S. Cl. .................. 333/175; 333/167; 333/185; 333/12
[58] Field of Search ............ 333/175, 167, 168, 185, 333/12, 176, 24 R, 24 C, 177, 178, 179, 180, 181, 182, 183, 184

[56] References Cited
U.S. PATENT DOCUMENTS
4,451,803 5/1984 Holdsworth et al. .......... 333/167 X Primary Examiner—Eugene R. LaRoche
Assistant Examiner—Ali Neyzari
Attorney, Agent, or Firm—Parkhurst, Wendel & Rossi

[57] ABSTRACT

A tuned filter having an improved Q is disclosed in which two or more inductors are placed in parallel to increase the net Q relative to a single inductor of the same net inductance and/or two or more capacitors are placed in series to increase the net Q relative to a single capacitor of the same net capacitance to improve the Q of a tuned filter.

11 Claims, 9 Drawing Sheets

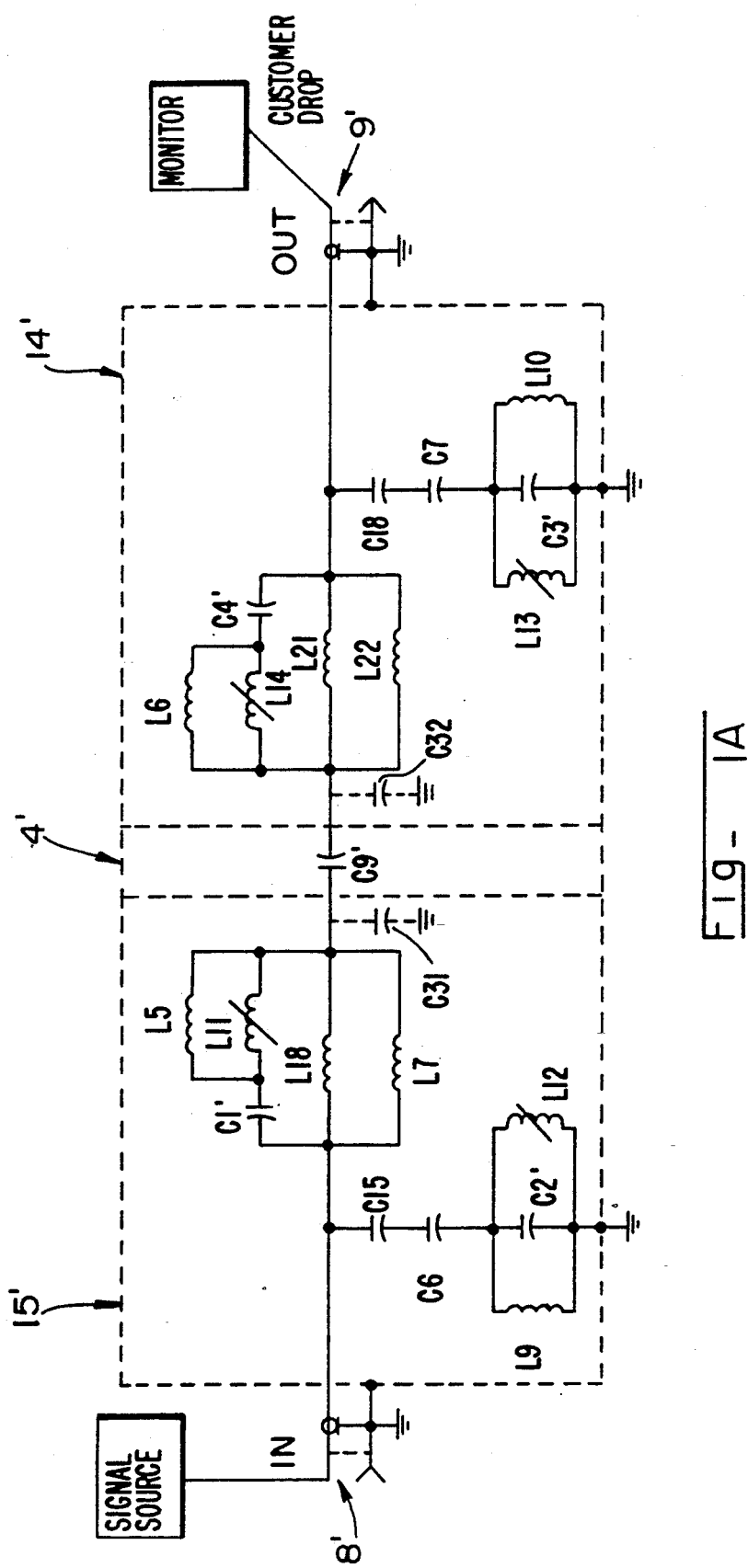

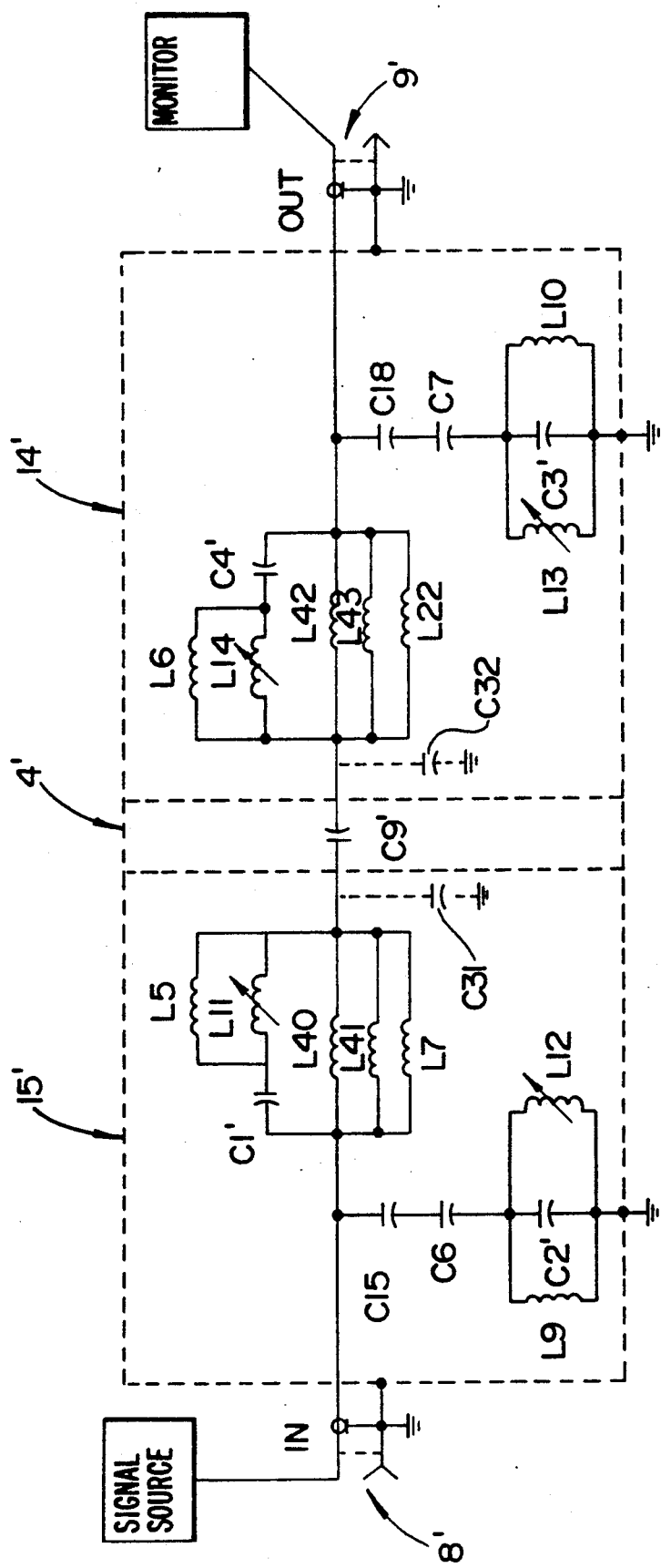

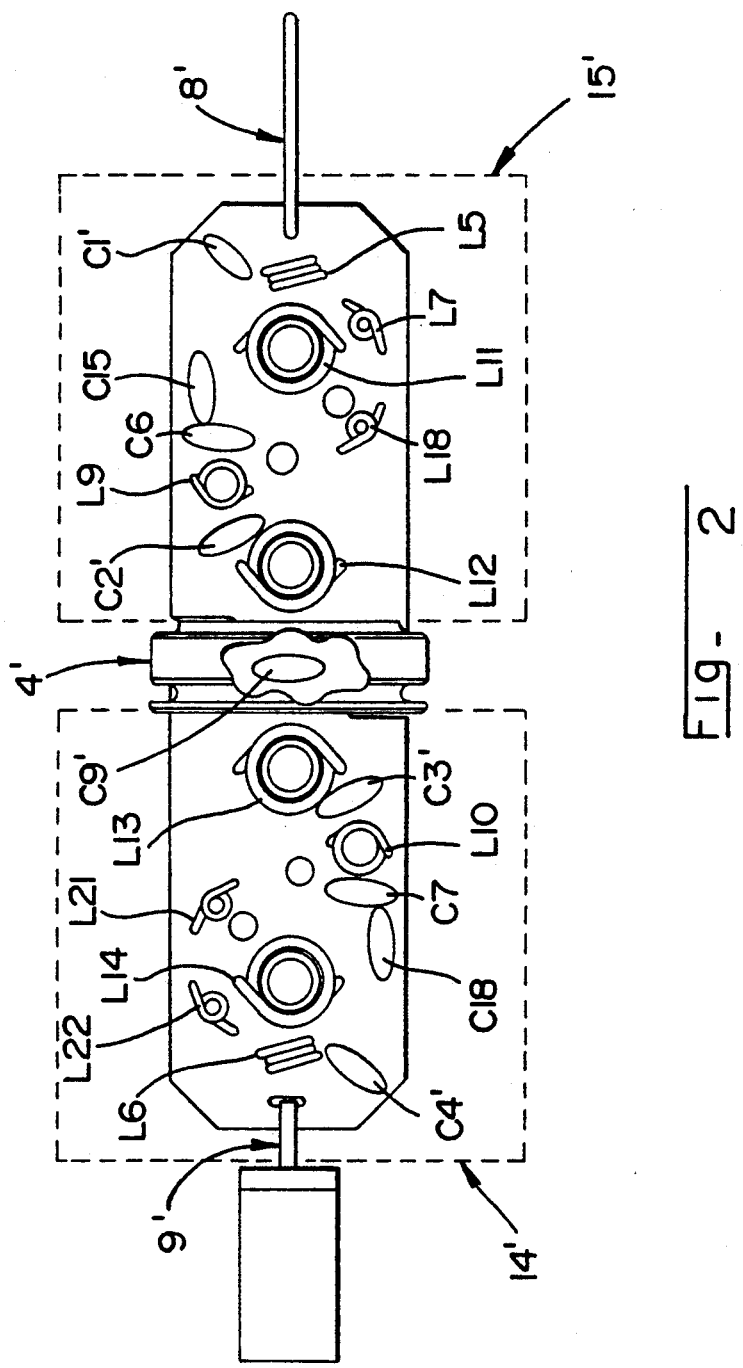

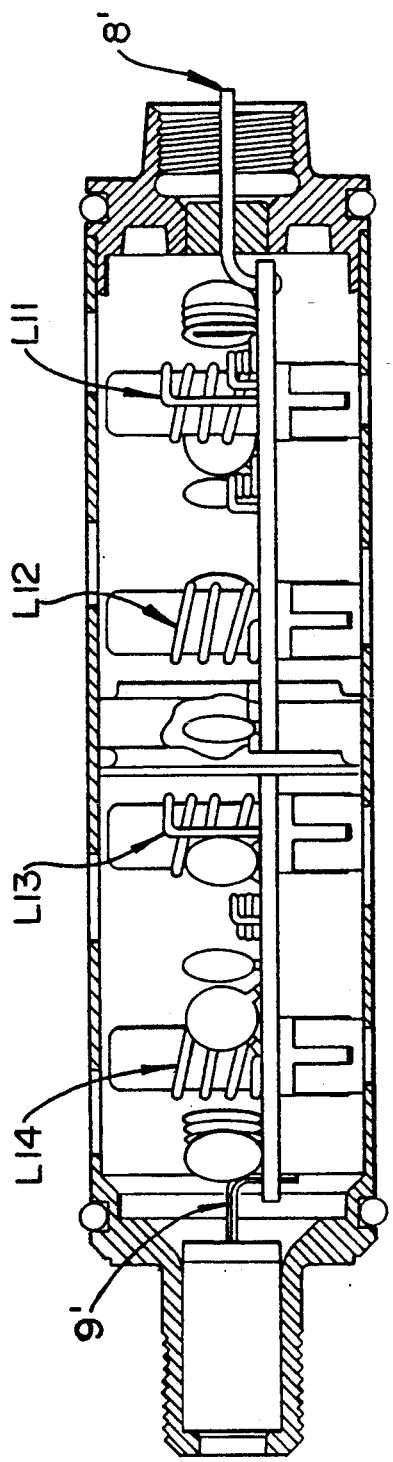

QUALITY FACTOR IMPROVEMENT FOR FILTER APPLICATIONS

FIELD OF THE INVENTION

The invention relates in general to tuned filters. More specifically, the invention relates to tuned filters, such as notch filters, which are particularly well suited for use in removing single or multiple frequency scrambling signals injected into a communication signal to eliminate the possibility of intelligible reception of video and/or audio information, or for use in removing a video carrier in a television channel to prevent its reception.

BACKGROUND OF THE INVENTION

It has long been a customary practice for subscription television communication systems—a system in which the reception of a television program signal, generally recoverable by a group of television receivers, is limited to specifically authorized receivers—to scramble or encode their television transmission signals to prevent unauthorized reception by individuals who have not paid a subscription fee. Conventional hard-wired community antenna television systems (CATV), for example, are representative of a typical subscription television communication system, although other systems have been developed that employ radio frequency (RF) transmission to subscribers instead of hard-wiring. If the subscription television system provides more than one channel, it is also desirable to provide selected scrambling or securing of individual channels that are used to provide premium services.

One of the methods most commonly employed to prevent unauthorized reception to add a scrambling signal or interfering carrier signal to the television transmission signal between its aural and visual carriers. The scrambling signal is added to the television transmission signal to provide additional information which causes a television receiver to reconstitute the scrambled television transmission signal in an incoherent form. The scrambling signal is removed by passing the scrambled television transmission signal through a tuned notch filter at the site of an authorized television receiver.

Tuned notch filters to be utilized in the video/audio frequency removal or descrambling process must meet several critical requirements. For example, it is critical that the tuned notch filter have a high degree of stability and reliability. In addition, the size of the notch filter must remain small, preferably less than 0.825 inch diameter, to enable the notch filter to be utilized in typical installations where one or more filters are mounted on a directional tap on a strand, in a pedestal, or some other small enclosure. The notch filter must also be capable of a large degree of attenuation at the center frequency of the notch with very sharp skirts and a narrow bandwidth to minimize unwanted attenuation of adjacent channels. As the frequency requirements increase, sharper skirts are required to maintain the desired bandwidth while minimizing interference with adjacent channels.

In order to achieve sharper skirts, the notch filter must have a high Q (Quality Factor), i.e., the bandwidth is minimized by optimization of the Q of the notch filters' inductors and capacitors. In most applications, the Q of the notch filter can be improved by utilizing inductors having larger winding diameters with larger diameter wire. In decoding and descrambling applications, however, the Q cannot be improved by utilizing larger coils due to the above-described size and corresponding layout restrictions.

In view of the above, it is an object of the invention to provide a highly reliable, narrow and stable notch filter having a high Q while minimizing the overall size of the notch filter. Further objects, features and advantages of the invention will become apparent from the ensuing detailed description of the preferred embodiment of the invention taken in connection with the accompanying drawings

SUMMARY OF THE INVENTION

The present invention is based on the recognition that the Q of a tuned filter can be improved, while minimizing the overall size of the filter to within restricted cavity size limitations, by replacing single inductors and capacitors in conventional filter structures with parallel multiple inductors and/or multiple series capacitors as required.

More specifically, in a preferred embodiment of the invention, a tuned filter is provided that includes an input terminal and an output terminal; a first network coupled to the input terminal and electrical ground including a plurality of series capacitors and/or a plurality of parallel inductors; and a second network coupled to the input terminal and the output terminal including at least one of a plurality of series capacitors and/or a plurality of parallel inductors. The Q of the filter is improved by the use of the series capacitors and/or parallel inductors opposed to single capacitors or inductors.

BRIEF DESCRIPTION OF THE DRAWINGS

With the above as background, reference should now be made to the detailed description of the preferred embodiment of the invention and the accompanying drawings in which:

FIGS. 1a-1e are an electrical schematic diagrams of filters in accordance with the invention;

FIG. 2 is a top plan view of a notch filter constructed on a circuit board in accordance with the invention;

FIG. 3 is a sectional side view through a notch filter of the type illustrated in FIG. 2 and accompanying housing;

DETAILED DESCRIPTION OF THE PREFERRED EMBODIMENT

Figure 5:
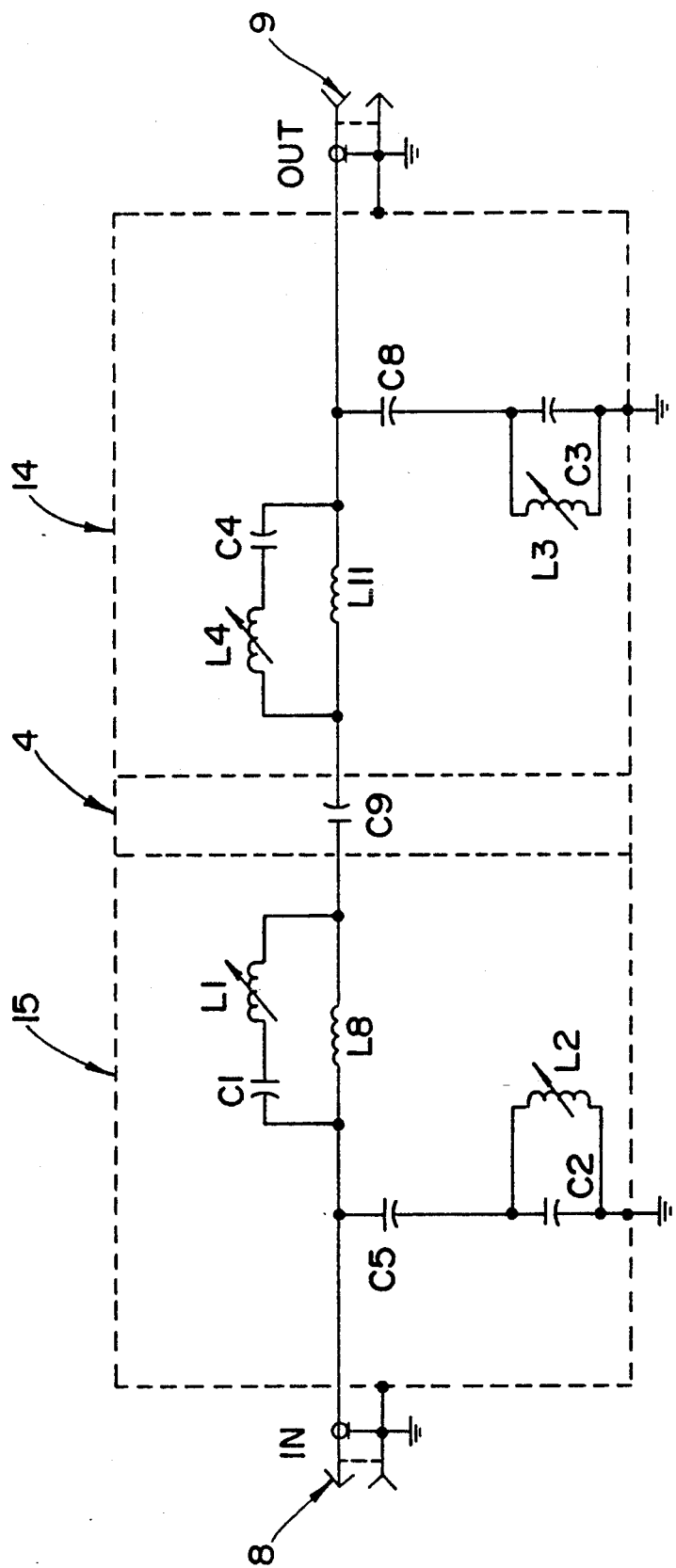
FIG. 5 is a schematic of a conventional notch filter.

Referring first to FIG. 5, an electrical schematic diagram of a conventional notch filter of the general type described in U.S. Pat. No. 4,451,803 is shown. An input terminal 8 is provided to receive an incoming communication signal, such as a television signal, including one or more signals which are to be removed (attenuated) by the notch filter. Input terminal 8 is connected to one terminal of capacitor C5 and the other terminal of capacitor C5 is connected to one terminal of a parallel arrangement of a capacitor C2 and an inductor L2. The other terminal of the parallel arrangement of capacitor C2 and inductor L2 is connected to a ground conductor. Terminal 8 is also connected to one terminal of an inductor L8 in parallel with a network consisting of capacitor C1 in series with an inductor L1. The other terminal of the network passes into an isolation area 4 and is connected to one terminal of a coupling capacitor C9. The circuitry described thus far, prior to the coupling capacitor C9, forms one filtering section 15.

The other terminal of capacitor C9 connects into filtering section 14 of the notch filter to one terminal of an inductor L11 which is connected in parallel with a network consisting of inductor L4 in series with a capacitor C4. The other terminal of this network is connected to the output terminal 9. Output terminal 9 is also connected to one terminal of capacitor C8 which in turn is connected at its other terminal to a parallel arrangement of a capacitor C3 and inductor L3. Remaining television signals exit through terminal 9.

The invention is based on the recognition that two or more inductors of the proper values can be connected in parallel to obtain a desired inductance with a Q that is greater than the Q for a single inductor of the equivalent inductance, and/or two or more capacitors of the proper values can be connected in series to obtain a desired capacitance with a Q which is greater than the Q for a single capacitor of equivalent capacitance in several areas of the conventional notch filter illustrated in FIG. 5. Having discovered this advantageous effect, our subsequent mathematical analyses confirmed that the utilization of two or more inductors or capacitors to replace a single inductor or capacitor can improve the Q of the overall notch filter:

Case 1

Two equal coils to equal one coil of half inductance where $L_0 = 0.0258$ μH is the desired inductance and $f = 100$ MHz.

The desired inductance can be achieved with one 0.125" diameter coil having 2.5 turns using 24 Gauge wire. The calculated theoretical value for this coil is $L_0 = 0.0258$ μH with $Q_0 = 337.8 @ 100$ MHz.

Knowing that two coils in parallel add per the following:

$$L_0 = (L_1^{-1} + L_2^{-1})^{-1}$$

For two equal coils, it can be determined that:

$$L_1 = L_2 = 0.0514 \ \mu H$$

This desired inductance for two equal coils can be achieved with 0.119" diameter coils having 4.5 turns using 22 Gauge wire. The calculated theoretical value for these coils is:

$$L_1 = L_2 = 0.0514 \ \mu H \text{ with } Q_1 = Q_2 = 473.7 @ 100 \ MHZ$$

$$X_{L1} = X_{L2} = jwL_1 = j2\pi f L_1 = j32.3 @ 100 \ MHZ$$

$$R_{L1} = R_{L2} = X_{L1}/Q_1 = 32.3/473.7 = 0.0682 \ \Omega$$

Since;

$$Z_L = R_L + X_L$$

and;

$$Z_{LO} = (Z_{L1}^{-1} + Z_{L2}^{-1})^{-1}$$

then $$R_{LO} + X_{LO} = ((R_{L1} + X_{L1})^{-1} + (R_{L2} + X_{L2})^{-1})^{-1}$$

$$R_{LO} + X_{LO} = 0.03409 + j16.15$$

$$Q_0 = X_{LO}/R_{LO} = 16.15/0.03409 = 473.7$$

$$L_0 = X_{LO}/jw = 16.15/2\pi f = 0.0257 \ \mu H$$

Thus, the resulting inductance of the two coils (0.0257 μH) is the same as the inductance of the single coil (0.0258 μH) if the round-off errors are taken into account. The Q of the two coils (473.7) is significantly improved, however, over the Q of the single coil (337.8).

Case 2

Two unequal coils to equal one coil of less inductance if the desired inductance is $L_o = 0.0435$ μH and $f = 100$ MHz.

The desired inductance can be achieved with one 0.180" diameter coil having 2.5 turns using 26 Gauge wire. The calculated theoretical value for this coil is $L_o = 0.0435$ μH with $Q_o = 333.1 @ 100$ MHz.

Arbitrarily picking one coil to be a 7.5 turn, 0.180" diameter coil using 26 Gauge wire, the other coil needs to be a 5.5 turn, 0.096" diameter coil using 24 Gauge wire. The resulting inductance and Q, for these coils, is as follows:

$$L_1 = 0.2264 \ \mu H \text{ with } Q_1 = 577.4 @ 100 \ MHZ$$

$$L_2 = 0.0539 \ \mu H \text{ with } Q_2 = 399.7 @ 100 \ MHZ$$

Calculating the resistances, impedances, and resultant inductance and Q, as in Case 1, give the following results:

$$L_0 = 0.0436 \ \mu H \text{ with } Q_0 = 424.9 @ 100 \ MHZ$$

The resulting inductance of the two coils (0.0436 μH) is the same as the inductance of the single coil (0.435 μH) if the round-off errors are taken into account. The Q of the two coils (424.9) is significantly improved over the Q of the single coil (333.1).

Case 3

Two capacitors to equal one capacitor of less capacitance.

Using a similar analysis to Case 1 and Case 2, an improvement, in Q, can be shown for two capacitors used in a series configuration where $C_o = 1.0$ pF is the desired capacitance and $f = 100$ MHz.

The desired capacitance can be achieved with one 1.0 pF capacitor which has a Q of $\geq 420$. The single capacitor can be replaced by two 2.0 pF capacitors in series which have a resultant capacitance of 1.0 pF and a resultant Q of $\geq 440$, or by a 1.5 pF capacitor in series with a 3.0 pF capacitor which have a resultant capacitance of 1.0 pF and a resultant Q of $\geq 439.56$. In both examples, the resultant capacitance was 1.0 pF, as desired, and an improvement in Q from 420 to approximately 440 was shown over a single capacitor of the same capacitance.

Figure 1B:
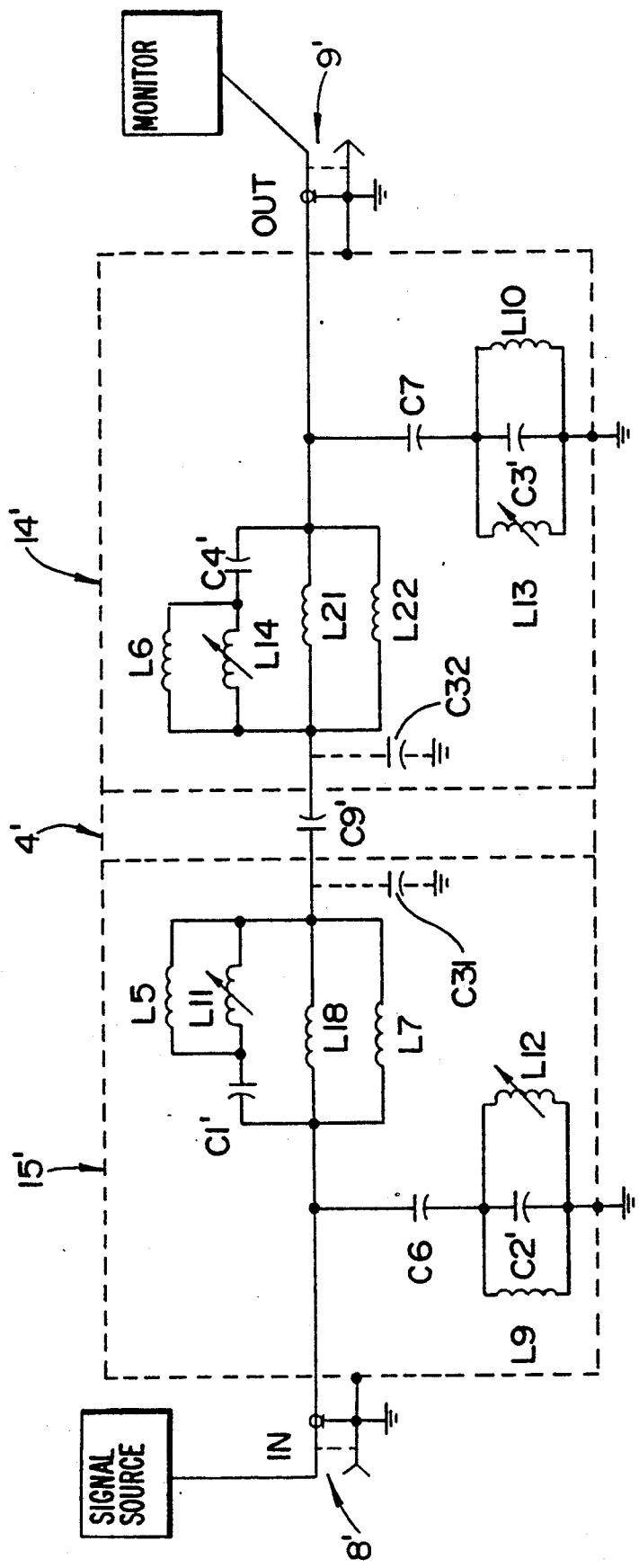
Figure 1C:
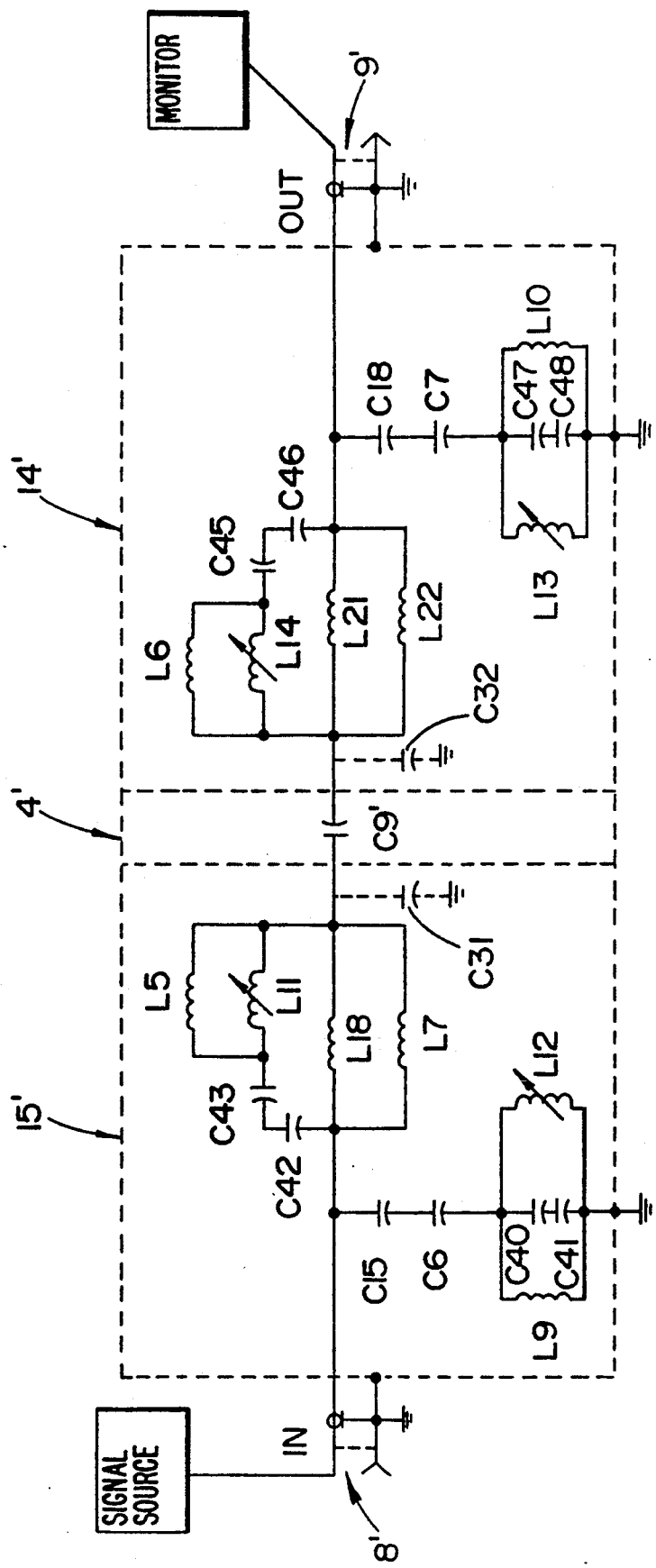
Figure 1E:
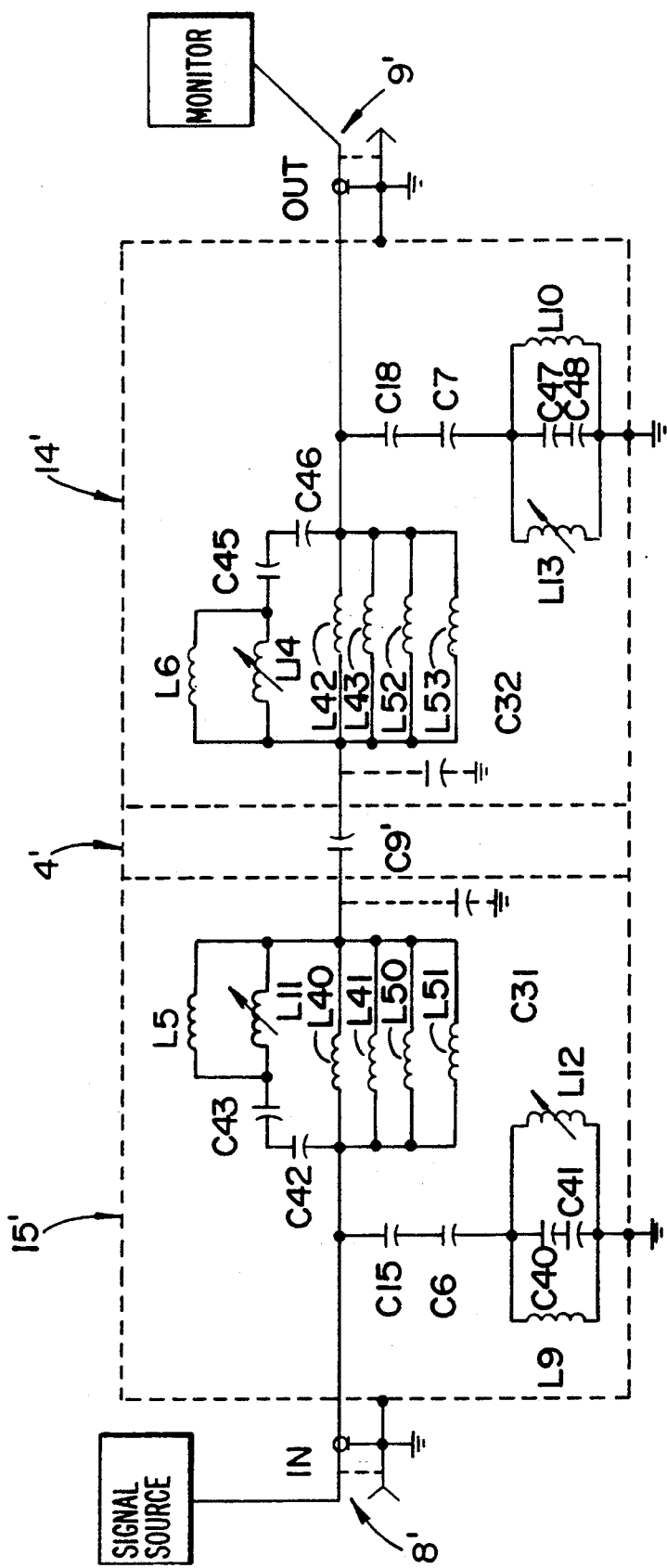

Referring now to FIG. 1a, an electrical schematic diagram of a notch filter in accordance with the invention is illustrated. A prime notation (') will be used to indicate components which correspond to the components of the conventional notch filter illustrated in FIG. 5. The notch filter shown in FIG. 1 includes an input terminal 8' that is coupled to a television signal source to receive an input signal. The input terminal 8' is connected to one terminal of a network including multiple capacitors C15 and C6 which are connected in a series configuration which gives them an increased Q as confirmed by the calculations provided above. The capacitor C6 is connected to a parallel arrangement of a capacitor C2' and multiple inductors L12 and L9. The inductors L12 and L9 are placed in a parallel configuration to increase the Q as described by the calculations provided above. The other terminal of the network including capacitor C2' and inductors L12 and L9 is connected to a ground conductor. Terminal 8' is also connected to one terminal of a network consisting of inductors L7 and L18, arranged in parallel for an improvement in Q, in parallel with a network consisting of capacitor C1' which is in series with multiple inductors L11 and L5 arranged in parallel for an improvement in Q. The circuit described thus far forms one filtering section 15' of the overall notch filter illustrated in FIG. 1. The filtering section 15', specifically the network including the multiple parallel inductors L18 and L7 and the network including capacitor C1' in series with parallel inductors L11 and L5 is connected to a coupling capacitor C9' of an isolation area 4'. An optional capacitor C31 coupled between the network and ground may also be utilized to improve high frequency response.

The other terminal of capacitor C9' connects into filtering section 14' to one terminal of a network (a capacitor C32 may also be provided as shown to improve high frequency response), consisting of multiple inductors L22 and L21, connected in parallel for an improvement in Q, which are in parallel with a terminal of a network consisting of multiple inductors L14 and L6, connected in parallel for an improvement in Q, in series with a capacitor C4'. The other terminal of this network is connected to the output terminal 9'. Output terminal 9' is also connected to a terminal of a network including multiple capacitors C18 and C7 which are connected in a series configuration to give them an increased Q. Capacitor C7 is connected to a parallel arrangement of a capacitor C3' and inductors L13 and L10. The inductors L13 and L10 are arranged in a parallel configuration to increase the Q. The other terminal of the parallel arrangement of capacitor C3' and inductors L13 and L10 is connected to a ground conductor. output terminal 9' and are supplied to a customer drop coupled to the output terminal 9'. The customer drop is then connected to a television monitor.

FIG. 1a thus shows two separate filtering sections 15' and 14' which correspond to the filtering sections 15 and 14 of the conventional notch filter illustrated in FIG. 5. The first filtering section 15' exists between input terminal 8' and isolation area 4' and the second filtering section 14' exists between isolation area 4' and output terminal 9'. The components of the filtering sections 14' and 15' and the isolation area 4' are physically arranged on a circuit board as shown in FIG. 2. The circuit board is placed within a housing as shown in FIG. 3.

In the preferred embodiment of the invention illustrated in FIG. 1a, the inductors L2, L3, L8, L1, L11 and L4 of the conventional notch filter illustrated in FIG. 5 were replaced by the parallel arrangements of inductors (L12, L9), (L13, L10), (L18, L7), (L11, L5), (L21, L22) and (L14, L6), respectively, to improve the overall Q of the notch filter. Similarly, the capacitors C5 and C8 of the conventional notch filter were replaced by the series capacitors (C15, C6) and (C18, C7), respectively, to improve the overall Q of the notch filter.

A further benefit of the invention is the ability to adjust or tune L11, L12, L13, and L14 to a natural pitch configuration, which in practice improves the Q. Natural pitch is the condition where a coil is positioned such that the space between adjacent turns is the same as the wire diameter. In previous designs of the type illustrated in FIG. 5, the coils were designed for a natural pitch condition, but component tolerances sometimes made it necessary to compress or stretch the coils from a natural pitch condition to compensate for tolerances. The coil windings and spaces for the preferred embodiment of the invention are shown on FIG. 3 as indicated by L11, L12, L13, and L14. Since parallel coils exist to obtain the desired inductance value, the inductors L11, L12, L13, and L14 can be positioned for a natural pitch condition and tolerances can be compensated for by stretching or compressing L5, L6, L9, and L10.

Figure 4:
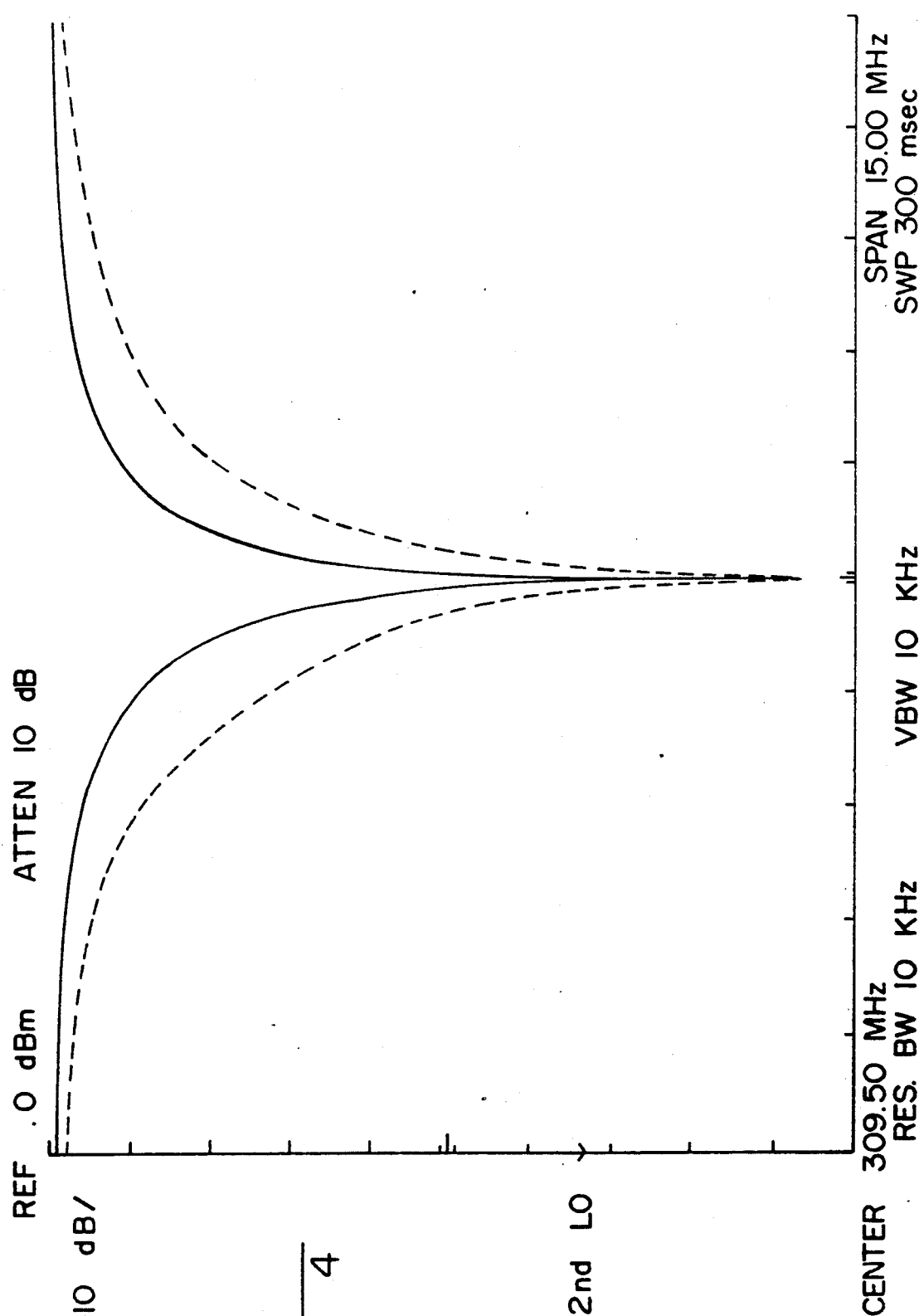
FIG. 4 is a data plot of a notch filter in accordance with the present invention overlaid on a data plot of a conventional notch filter.

FIG. 4 shows the difference in performance of a conventional tuned notch filter of the type illustrated in FIG. 5 (shown as a dashed line) and a tuned notch filter of the type illustrated in FIG. 1 (shown as a solid line). The filter illustrated in FIG. 5 has an overall Q of 45.467 while the filter in FIG. 1a has an overall Q of 101.05. As can be readily appreciated, the notch filter of the invention has a much sharper response and corresponding 40% or greater improvement in bandwidth, characteristics which are highly desirable when used in higher frequency television channels. Thus, conventional filters having Q's ranging from 35-60 can be easily modified by the practice of the invention to yield Q's. of 70 or greater with corresponding improvements in response.

The invention has been described with reference to certain preferred embodiments thereof. It will be understood, however, that variations and modifications are possible within the scope of the appended claims. For example, although the invention was described with reference to a notch filter having two filtering sections, the invention is applicable to filters having more than two filtering sections. For example, one or more of the filter or filter sections can be connected in series to obtain better frequency response with more attenuation. The invention is also applicable to filters in general and is not limited solely to notch filters. It will also be understood that various permutations of the basic filter structure are possible, i.e., series capacitors and/or parallel inductors can be used to replace single elements throughout the filter structure in any desired combination. Several examples of such permutations are illustrated in FIGS. 1b–1e.

What is claimed is:

1. A filter comprising: an input terminal and an output terminal; a first network, including at least two series capacitors connected to at least two inductors and at least one capacitor arranged in parallel, coupled to the input terminal and electrical ground; a second network and a third network connected in parallel and coupled to the input terminal and the output terminal, wherein the second network includes at least two inductors coupled in parallel and the third network includes at least one capacitor connected in series to at least two parallel inductors.

2. The filter as claimed in claim 1, wherein the input terminal is coupled to a television signal source and the output terminal is coupled to a television monitor.

3. The filter as claimed in claim 2, further comprising a capacitor connected between the output terminal and electrical ground.

4. A filter comprising:
an input terminal, an output terminal and an isolation section located between the input terminal and the output terminal;
a first filtering section comprising a first network including at least two series capacitors connected to at least two inductors and at least one capacitor arranged in parallel, wherein the first network is connected to the input terminal and electrical ground, a second network and a third network connected in parallel and coupled to the input terminal and the isolation section, wherein the second network includes at least two inductors coupled in parallel and the third network includes at least one capacitor connected in series to at least two parallel inductors; and
a second filter section comprising a fourth network and a fifth network connected in parallel and coupled to the isolation section and the output terminal, wherein the fourth network includes at least two inductors coupled in parallel and the fifth network includes at least one capacitor connected in series to at least two parallel inductors, and a sixth network including at least two series capacitors connected to at least two inductors and at least one capacitor arranged in parallel, wherein the sixth network is coupled to the output terminal and electrical ground.

5. The filter as claimed in claim 4, wherein the input terminal is coupled to a television signal source and the output terminal is coupled to a television monitor.

6. The filter as claimed in claim 4, wherein the isolation section includes a capacitor which blocks AC/DC currents.

7. A filter comprising: an input terminal and an output terminal, a first network coupled to the input terminal and electrical ground including at least one capacitor connected in series to the combination of at least one capacitor coupled in parallel with a plurality of inductors, a second network coupled to the input terminal and the output terminal including at least one inductor connected in parallel to the combination of at least one capacitor coupled in series with a plurality of parallel inductors.

8. A filter as claimed in claim 7, further comprising a third network and a fourth network coupled between the second network and the output terminal, wherein the third network is connected to an output of the second network and to the output terminal and the fourth network is connected to output terminal and electrical ground, and wherein the third network includes a single inductor or a plurality of parallel inductors connected in parallel with a single capacitor or a plurality of series capacitors in series with a single inductor or a plurality of inductors, and the fourth network includes a single capacitor or a plurality of series capacitors connected to a single capacitor or a plurality of series capacitors in parallel with a single inductor or a plurality of parallel inductors.

9. The filter as claimed in claim 8, further comprising a blocking capacitor coupled between the second network and the third network.

10. The filter as claimed in claim 7, further comprising a capacitor coupled between the output of the second network and electrical ground to improve higher frequency response.

11. The filter as claimed in claim 8, further comprising a capacitor coupled between an input to the third network and electrical ground to improve higher frequency response.

* * * * *